United States Patent
Urino

(10) Patent No.: US 10,644,822 B2
(45) Date of Patent: May 5, 2020

(54) NETWORK SYSTEM

(71) Applicant: PHOTONICS ELECTRONICS TECHNOLOGY RESEARCH ASSOCIATION, Tokyo (JP)

(72) Inventor: Yutaka Urino, Tokyo (JP)

(73) Assignee: PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 16/344,269

(22) PCT Filed: Sep. 6, 2017

(86) PCT No.: PCT/JP2017/032025
§ 371 (c)(1),
(2) Date: Apr. 23, 2019

(87) PCT Pub. No.: WO2018/079086
PCT Pub. Date: May 3, 2018

(65) Prior Publication Data
US 2019/0268085 A1   Aug. 29, 2019

(30) Foreign Application Priority Data
Oct. 26, 2016   (JP) .................... 2016-209412

(51) Int. Cl.
*H04J 14/02* (2006.01)
*G02F 1/017* (2006.01)
(Continued)

(52) U.S. Cl.
CPC .......... *H04J 14/0221* (2013.01); *G02F 1/015* (2013.01); *G02F 1/01708* (2013.01);
(Continued)

(58) Field of Classification Search
CPC .... H04J 14/0221; H04J 14/02; H04J 14/0209; H04J 14/0227; G02F 1/015;
(Continued)

(56) References Cited

U.S. PATENT DOCUMENTS

| 6,768,827 B2 * | 7/2004 | Yoo | ........................ B82Y 20/00 385/14 |
| 7,120,358 B2 * | 10/2006 | Okada | ................ H04Q 11/0005 398/49 |

(Continued)

FOREIGN PATENT DOCUMENTS

| JP | H04-219737 A | 8/1992 |
| JP | 2001-333021 A | 11/2001 |

(Continued)

OTHER PUBLICATIONS

K. Yashiki et al., "25-Gbps/ch Error-Free Operation over 300-m MMF of Low-Power-Consumption Silicon-Photonics-Based Chip-Scale Optical I/O Cores", IEICE Trans. Electron., Feb. 2016, pp. 148-156, vol. E99-C, No. 2, The Institute of Electronics, Information and Communication Engineers.

(Continued)

*Primary Examiner* — Abbas H Alagheband
(74) *Attorney, Agent, or Firm* — Michael Best & Friedrich LLP

(57) ABSTRACT

A network system comprises a plurality of nodes and a plurality of optical amplifiers. A first node comprises a first transmitter configured to send a wavelength-division-multiplexed optical signal and a first receiver configured to receive a wavelength-division-multiplexed optical signal, and the second node comprises a second transmitter configured to send a wavelength-division-multiplexed optical signal and a second receiver configured to receive a wavelength-division-multiplexed optical signal. The first and second transmitters are optically connected to an input of the (Continued)

first optical amplifier and an input of the second optical amplifier, respectively, and the first and second receivers are optically connected to an output of the first optical amplifier and an output of the second optical amplifier, respectively. The receivers each comprise a photoreceiver and a reception circuit. The photoreceiver is electrically connected, by flip chip connection, to a reception circuit. A reception circuit is configured not to comprise a transimpedance amplifier.

13 Claims, 8 Drawing Sheets

(51) Int. Cl.

| | | |
|---|---|---|
| *G02F 1/025* | (2006.01) | |
| *H01S 3/11* | (2006.01) | |
| *H04B 10/40* | (2013.01) | |
| *G02F 1/015* | (2006.01) | |
| *H01L 31/02* | (2006.01) | |
| *H04B 10/2587* | (2013.01) | |
| *H04B 10/2575* | (2013.01) | |
| *H04B 10/077* | (2013.01) | |
| *G02B 6/28* | (2006.01) | |
| *G02B 6/36* | (2006.01) | |

(52) U.S. Cl.
CPC .............. *G02F 1/025* (2013.01); *H01L 31/02* (2013.01); *H01S 3/1118* (2013.01); *H04B 10/40* (2013.01); *H04J 14/02* (2013.01); *H04J 14/0209* (2013.01); *H04J 14/0227* (2013.01); *G02B 6/28* (2013.01); *G02B 6/36* (2013.01); *H04B 10/077* (2013.01); *H04B 10/2575* (2013.01); *H04B 10/2587* (2013.01)

(58) Field of Classification Search
CPC ..... G02F 1/01708; G02F 1/025; H01L 31/02; H01S 3/1118; H04B 10/40
USPC .......................................................... 398/83
See application file for complete search history.

(56) References Cited

U.S. PATENT DOCUMENTS

| | | | | |
|---|---|---|---|---|
| 8,401,390 | B2* | 3/2013 | Ogura ................. | H04B 10/505 |
| | | | | 385/14 |
| 8,606,107 | B2* | 12/2013 | Bai ...................... | H04B 10/506 |
| | | | | 398/70 |
| 9,215,114 | B2* | 12/2015 | Emami-Neyestanak | .................... |
| | | | | H03F 1/08 |
| 10,411,807 | B1* | 9/2019 | Earnshaw .......... | H04B 10/5561 |
| 2002/0191904 | A1 | 12/2002 | Kani et al. | |
| 2004/0141743 | A1 | 7/2004 | Okada et al. | |
| 2005/0013618 | A1* | 1/2005 | Kurebayashi .... | H04B 10/25133 |
| | | | | 398/188 |
| 2006/0153496 | A1* | 7/2006 | Tanobe ............... | H04J 14/0227 |
| | | | | 385/24 |
| 2013/0294546 | A1* | 11/2013 | Emami-Neyestanak | .................... |
| | | | | H04L 25/061 |
| | | | | 375/319 |
| 2013/0315599 | A1* | 11/2013 | Lam ....................... | H04J 14/02 |
| | | | | 398/79 |
| 2014/0079385 | A1* | 3/2014 | Shukunami ........ | H04B 10/0775 |
| | | | | 398/16 |
| 2014/0314414 | A1* | 10/2014 | Cheng ..................... | H04J 14/02 |
| | | | | 398/68 |
| 2015/0086207 | A1 | 3/2015 | Chen | |
| 2016/0204876 | A1* | 7/2016 | Kamura ............. | H04J 14/0227 |
| | | | | 398/34 |
| 2019/0158211 | A1* | 5/2019 | Furst ...................... | H04B 10/40 |

FOREIGN PATENT DOCUMENTS

| | | |
|---|---|---|
| JP | 2003-069502 A | 3/2003 |
| JP | 2005-039493 A | 2/2005 |

OTHER PUBLICATIONS

International Search Report issued in Application No. PCT/JP2017/032025, dated Nov. 28, 2017.

* cited by examiner

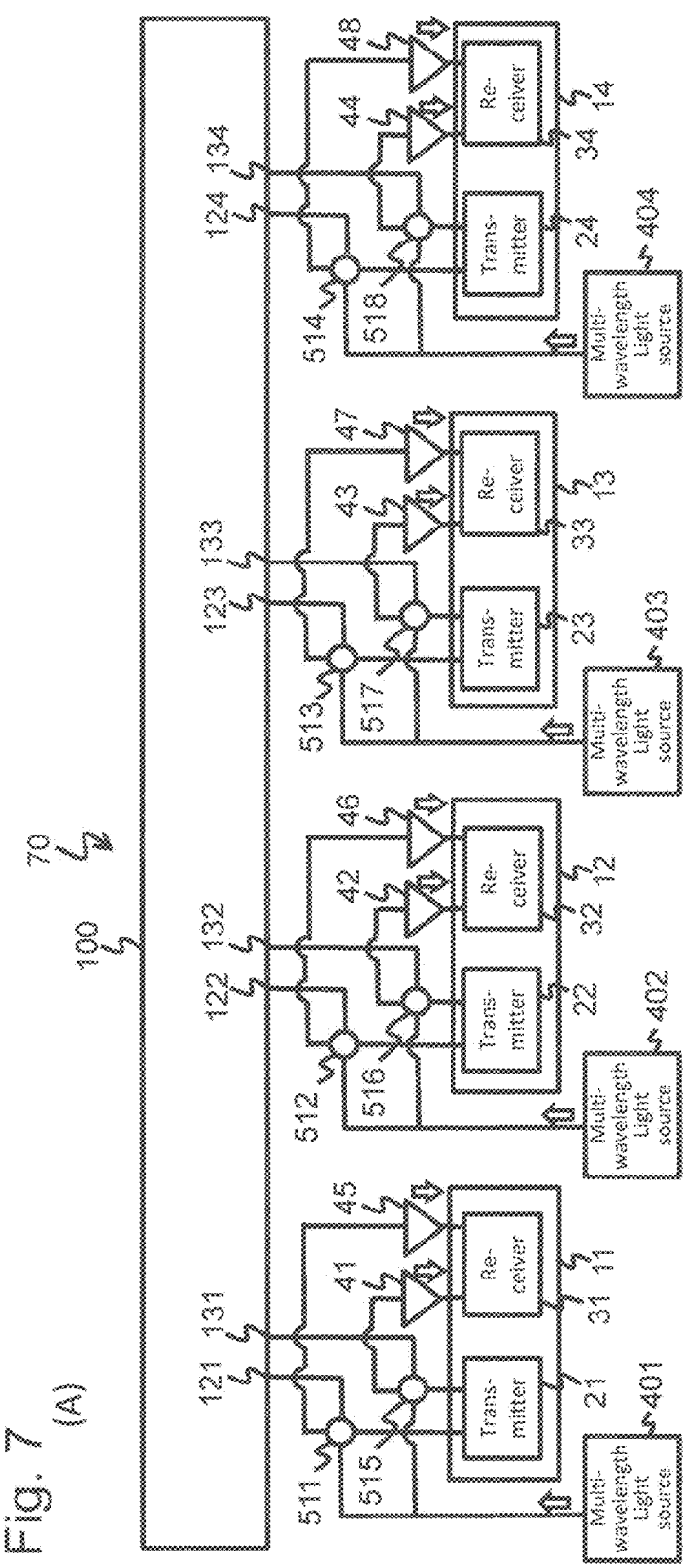

NETWORK SYSTEM

TECHNICAL FIELD

The embodiments of the present invention relate to network systems.

BACKGROUND ART

Regardless of whether the scale of a communication network is large or small, demand for enlargement of capacity of communication between nodes, which are components of a network, has been growing more and more. For meeting the above demand, some techniques for eliminating various bottlenecks relating to optical interconnections have been developed.

For example, Non-patent Literature 1 discloses a technique that realizes error-free operation of 25 Gbps/ch over a multimode fiber having a length of 300 meters, by use of a silicon-photonics-based optical transceiver.

According to the technique disclosed in Non-patent Literature 1, optical interconnection of 25 Gbps/ch via an optical fiber requires electric power consumption of approximately 5 mW/Gbps. This value does not include electric power consumption of a laser diode which is a light source. When the electric power consumption of the laser diode is taken into consideration, further electric power consumption is required for realizing the system disclosed in Non-patent Literature 1. Further, in the case that N nodes are connected in a full mesh manner by use of the above optical transceiver, $2N*(N-1)$ optical fibers are required. Thus, in the case that N is large, the network system becomes large.

CITATION LIST

Non Patent Literature

NPL 1: Kenichiro Yashiki et al., "25-Gbps/ch error-free operation over 300-m MMF of low-power-consumption silicon-photonics-based chip-scale optical I/O cores," IEICE Trans. Electron., vol. E99-C, No. 2, 2016, pp. 148-156

SUMMARY OF INVENTION

An embodiment of the present invention provides a network system which is characterized by low power consumption, high speed, compactness, and low cost.

In an embodiment of the present invention, a network system comprises a plurality of nodes comprising at least a first node and a second node; wherein, the first node comprises a first transmitter configured to send a wavelength-division-multiplexed optical signal and a first receiver configured to receive a wavelength-division-multiplexed optical signal, and the second node comprises a second transmitter configured to send a wavelength-division-multiplexed optical signal and a second receiver configured to receive a wavelength-division-multiplexed optical signal. The network system further comprises a plurality of optical amplifiers comprising at least a first optical amplifier and a second optical amplifier; wherein, the first transmitter and the second transmitter are optically connected to an input of the first optical amplifier and an input of the second optical amplifier, respectively; and the first receiver and the second receiver are optically connected to an output of the first optical amplifier and an output of the second optical amplifier, respectively. The first receiver comprises a first photoreceiver and a first reception circuit, and the second receiver comprises a second photoreceiver and a second reception circuit. The first photoreceiver and the second photoreceiver are electrically connected, by flip chip connection, to the first reception circuit and the second reception circuit, respectively. Neither the first reception circuit nor the second reception circuit comprises a transimpedance amplifier.

Advantageous Effects of Invention

According to the embodiment of the present invention, a network system which is characterized by low power consumption, high speed, compactness, and low cost can be provided.

BRIEF DESCRIPTION OF DRAWINGS

FIG. 1 (B) shows a schematic cross-section view of a receiver according to an embodiment of the present invention. FIG. 1 (C) shows a schematic cross-section view of a transmitter according to an embodiment of the present invention.

FIG. 3 (B) is a table showing an example of a routing characteristic of a cyclic wavelength routing device.

FIG. 5A (b) shows an example configuration of a light folding device.

Figure 4:
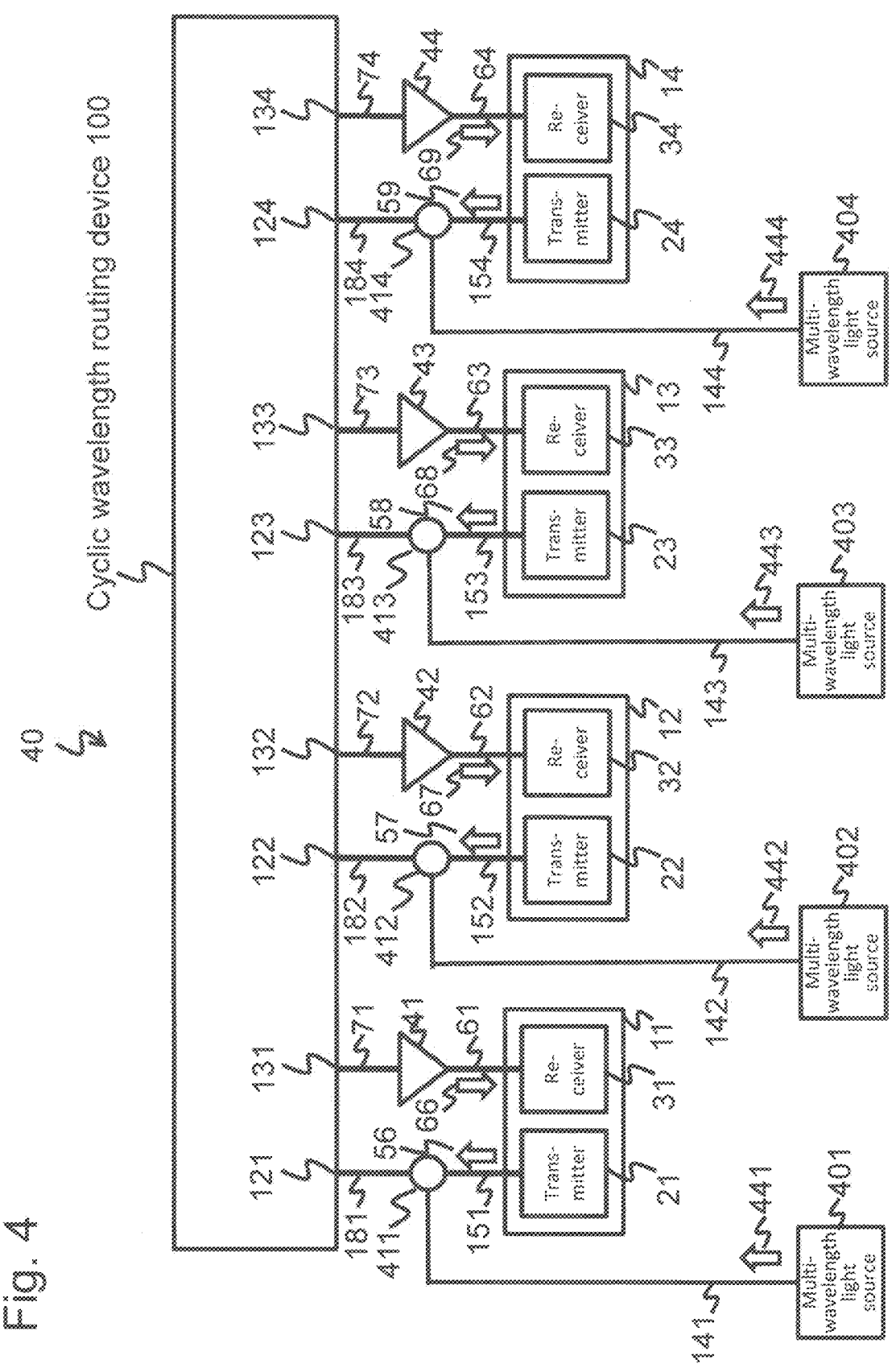
FIG. 4 shows a block diagram of a network system according to an embodiment of the present invention.
Figure 5A:
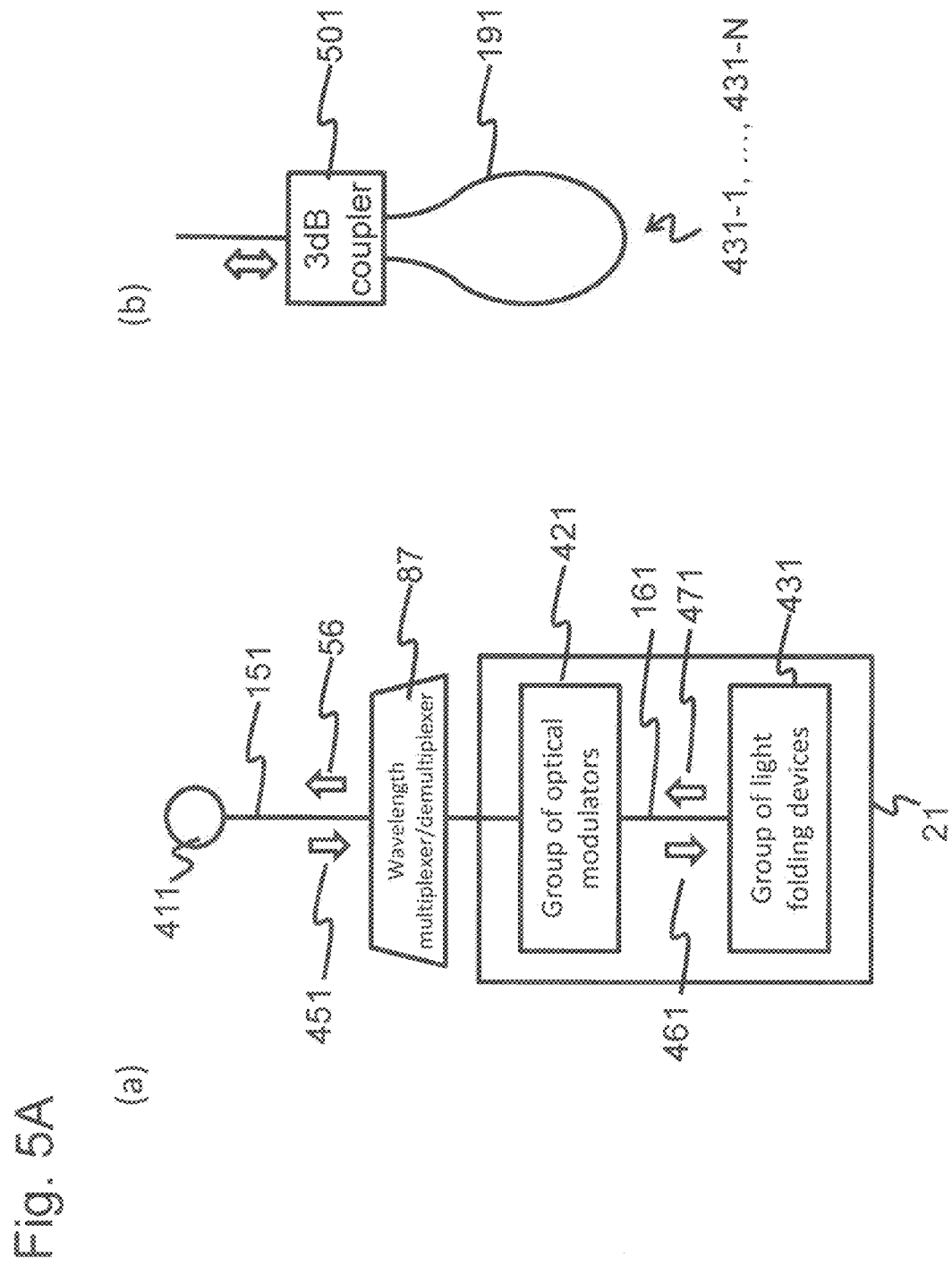
FIG. 5A (a) is a block diagram showing a configuration of the transmitter and relation of connection between the transmitter and an optical circulator in the network system shown in FIG. 4.
Figure 5B:
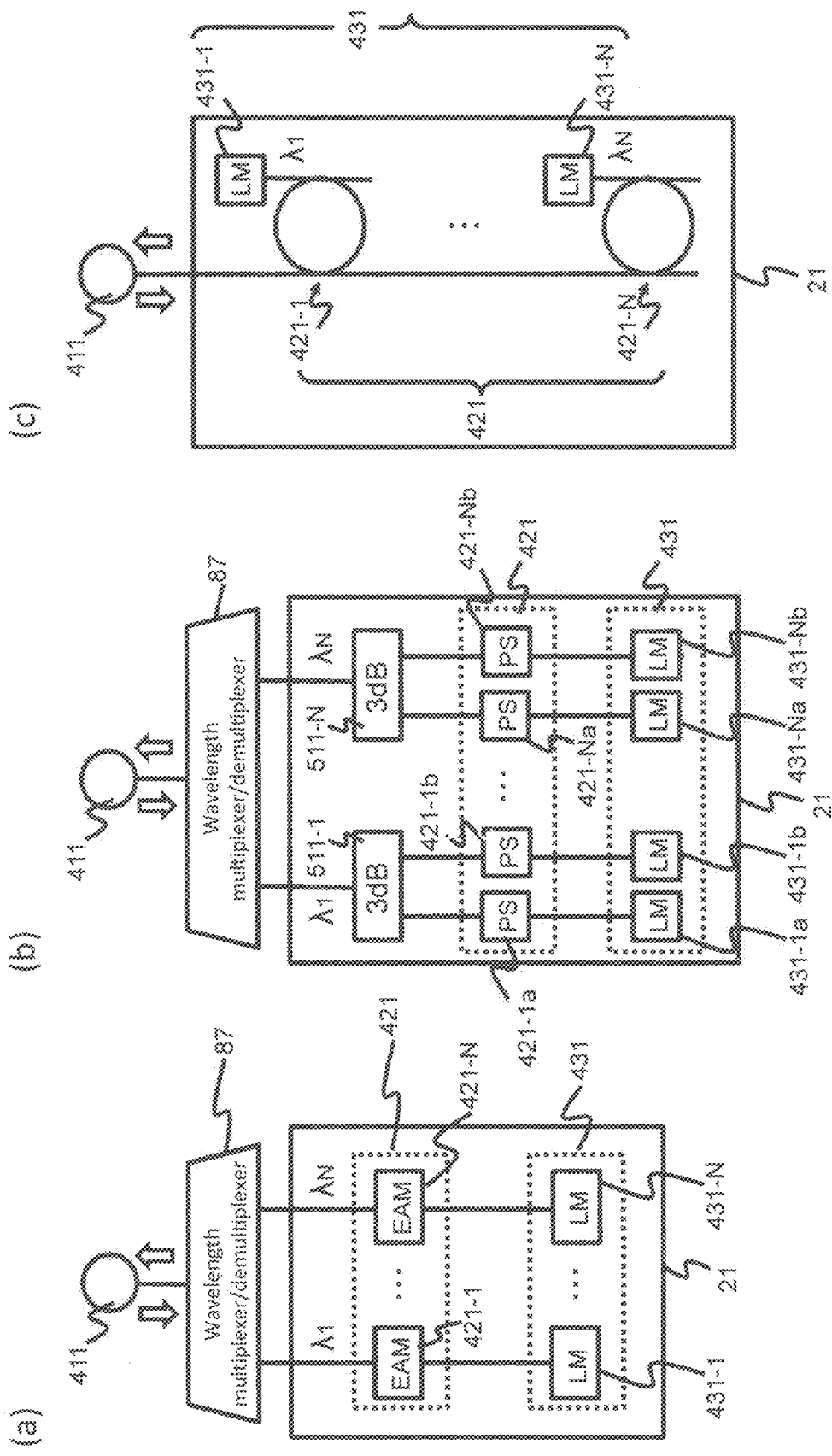

Each of (a)-(c) of FIG. 5B is a block diagram of an example configuration of the transmitter in the system shown in FIG. 4.

Figure 6:
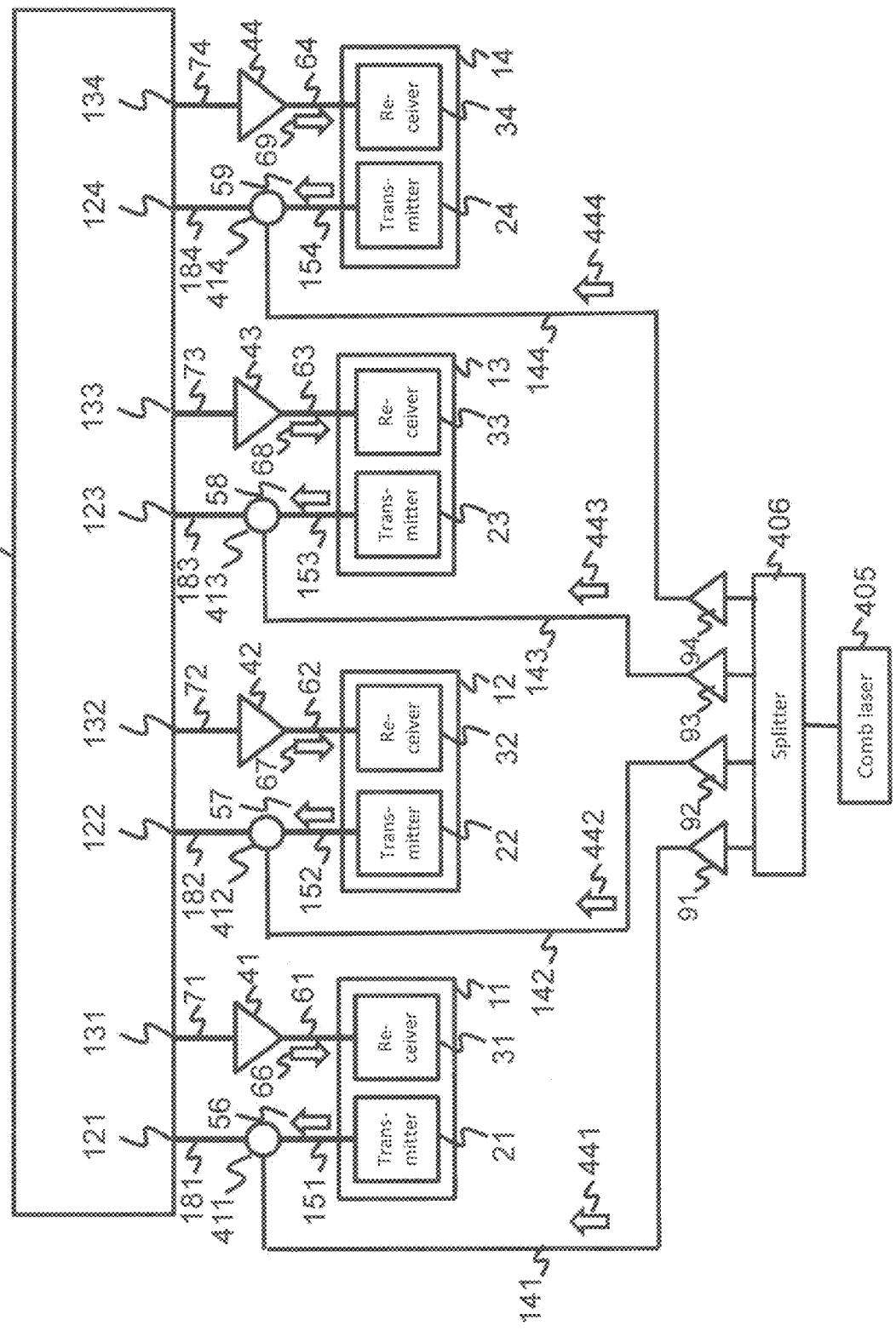

FIG. 6 shows a block diagram of a network system according to an embodiment of the present invention.

FIGS. 7 (A) and (B) show block diagrams of a network system according to an embodiment of the present invention.

DESCRIPTION OF EMBODIMENTS

First, contents of embodiments of the present invention will be enumerated and explained. The network systems according to the embodiments of the present invention comprise the following configurations.

(Item 1)

A network system comprises:

a plurality of nodes comprising at least a first node and a second node, wherein the first node comprises a first transmitter configured to send a wavelength-division-multiplexed optical signal and a first receiver configured to receive a wavelength-division-multiplexed optical signal, and the second node comprises a second transmitter configured to send a wavelength-division-multiplexed optical signal and a second receiver configured to receive a wavelength-division-multiplexed optical signal; and a plurality of optical amplifiers comprising at least a first optical amplifier and a second optical amplifier, wherein the first transmitter and the second transmitter are optically connected to an input of the first optical amplifier and an input of the second optical amplifier, respectively, and the first receiver and the second receiver are optically connected to an output of the first optical amplifier and an output of the second optical amplifier, respectively; wherein the first receiver comprises a first photoreceiver and a first reception circuit; the second receiver comprises a second photoreceiver and a second reception circuit; the first photoreceiver and the second photoreceiver are electrically connected, by flip chip connection, to the first reception circuit and the second reception circuit, respectively; and neither the first reception circuit nor the second reception circuit comprises a transimpedance amplifier.

(Item 2)

The network system disclosed in above item 1 further comprises:

a cyclic wavelength routing device comprising a first plurality of ports and a second plurality of ports; wherein the first transmitter and the second transmitter are optically connected to a first port and a second port in the first plurality of ports of the cyclic wavelength routing device, respectively; and the input of the first optical amplifier and the input of the second optical amplifier are optically connected to a first port and a second port in the second plurality of ports of the cyclic wavelength routing device, respectively.

(Item 3)

The network system disclosed in above item 2 further comprises:

a plurality of multiwavelength light sources comprising at least a first multiwavelength light source and a second multiwavelength light source which are configured to output wavelength-division-multiplexed light; and a plurality of optical circulators comprising at least a first optical circulator and a second optical circulator; wherein the first transmitter comprises a first group of optical modulators and a first group of light folding devices optically connected to the first group of optical modulators, and the second transmitter comprises a second group of optical modulators and a second group of light folding devices optically connected to the second group of optical modulators, each of the plurality of optical circulators comprises at least three ports, and is configured to output light, that is inputted to a first port, from a second port, and output the light, that is inputted to the second port, from a third port; the first port of the first optical circulator and the first port of the second optical circulator are optically connected to the first multiwavelength light source and the second multiwavelength light source, respectively; the second port of the first optical circulator and the second port of the second optical circulator are optically connected to the first transmitter and the second transmitter, respectively; and the third port of the first optical circulator and the third port of the second optical circulator are optically connected to a first port and a second port in the first plurality of ports of the cyclic wavelength routing device, respectively; and the wavelength-division-multiplexed light inputted to the first transmitter and the wavelength-division-multiplexed light inputted to the second transmitter propagate through the first group of optical modulators and the second group of optical modulators in a round trip manner via the first group of light folding devices and the second group of light folding devices, and are sent from the first transmitter and the second transmitter as wavelength-division-multiplexed optical signals, respectively.

(Item 4)

The network system disclosed in above item 3 further comprises:

a plurality of wavelength multiplexer/demultiplexer's comprising a first wavelength multiplexer/demultiplexer positioned between the first optical circulator and the first group of optical modulators, and a second wavelength multiplexer/demultiplexer positioned between the second optical circulator and the second group of optical modulators, wherein each optical modulator in the first group of optical modulators and the second group of optical modulators is an electroabsorption modulator, and each light folding device in the first group of light folding devices and the second group of light folding devices is a loop mirror.

(Item 5)

The network system disclosed in above item 3 further comprises:

a plurality of wavelength multiplexer/demultiplexer's comprising a first wavelength multiplexer/demultiplexer positioned between the first optical circulator and the first group of optical modulators, and a second wavelength multiplexer/demultiplexer positioned between the second optical circulator and the second group of optical modulators, wherein a Michelson-interferometer-type modulator is formed by an optical modulator in the first group of optical modulators and the second group of optical modulators and a light folding device in the first group of light folding devices and the second group of light folding devices.

(Item 6)

In the network system disclosed in above item 3, each optical modulator in the first group of optical modulators and the second group of optical modulators is a ring modulator, and each light folding device in the first group of light folding devices and the second group of light folding devices is a loop mirror.

(Item 7)

In the network system disclosed in one of above items 3-6, the plurality of optical amplifiers comprises a third optical amplifier and a fourth optical amplifier, wherein an output of the third optical amplifier and an output of the fourth optical amplifier are optically connected to the first receiver and the second receiver, respectively;

each of the plurality of optical circulators comprises a fourth port, and is configured to output light, that is inputted to the third port, from the fourth port; and the fourth port of the first optical circulator and the fourth port of the second optical circulator are optically connected to an input of the third optical amplifier and an input of the fourth optical amplifier, respectively;

the plurality of optical circulators comprises a third optical circulator and a fourth optical circulator; and the first port of the third optical circulator and the first port of the fourth optical circulator are optically connected to the first multiwavelength light source and the second multiwavelength light source, respectively; the second port of the third optical circulator and the second port of the fourth optical circulator are optically connected to the first transmitter and the second transmitter, respectively; the third port of the third optical circulator and the third port of the fourth optical circulator are optically connected to a first port and a second port in the second plurality of ports of the cyclic wavelength routing device, respectively; and the fourth port of the third optical circulator and the fourth port of the fourth optical circulator are optically connected to the input of the first optical amplifier and the input of the second optical amplifier, respectively.

(Item 8)

In the network system disclosed in one of above items 3-7, the first group of optical modulators and the second group of optical modulators are formed in an SOI (Silicon on Insulator) layer formed on a buried oxide film layer on a silicon substrate.

(Item 9)

In the network system disclosed in one of above items 1-8, the first photoreceiver and the second photoreceiver are formed in an SOI (Silicon on Insulator) layer formed on a buried oxide film layer on a silicon substrate.

(Item 10)

In the network system disclosed in one of above items 1-9, each of the plurality of optical amplifiers is an optical fiber amplifier.

(Item 11)

In the network system disclosed in one of above items 2-8, the cyclic wavelength routing device is a cyclic arrayed waveguide grating.

(Item 12)

In the network system disclosed in one of above items 3-8, each of the plurality of multiwavelength light sources comprises a comb laser.

(Item 13)

In the network system disclosed in one of above items 3-8, the plurality of multiwavelength light sources comprises a comb laser, and a splitter optically connected to an output of the comb laser and comprising a plurality of outputs, wherein a first output and a second output in the plurality of outputs are optically connected to the first transmitter and the second transmitter, respectively.

(Item 14)

The network system disclosed in above item 13 further comprises:

an optical amplifier positioned between the first output of the splitter and the first transmitter, and an optical amplifier positioned between the second output of the splitter and the second transmitter.

(Item 15)

The network system disclosed in one of above items 3-8 and 12-14 is characterized in that: the first transmitter and the second transmitter comprise a first driving circuit and a second driving circuit, respectively; and the first group of optical modulators and the second group of optical modulators are electrically connected, by flip chip connection, to the first driving circuit and the second driving circuit, respectively.

Embodiments of the present invention will be explained in detail in the following description.

The inventor of the invention of the subject application found that it is necessary, in prior art, to make a signal-to-noise power ratio (SNR) at an output of a receiving circuit equal to or higher than 23 dB, for realizing error-free transmission (usually, an error rate equal to or less than $10^{-12}$). The inventor of the invention of the subject application also found, in prior art, that a main source of noise is a receiving circuit, especially, thermal noise from a transimpedance amplifier (TIA), and that the minimum optical amplitude (the minimum reception sensitivity) that should be inputted to a photoreceiver and the amplification factor of a TIA are defined based mainly on the quantity of the thermal noise. In addition, the inventor of the invention of the subject application found that the optical amplitude required in an output of an optical modulator is defined, and a voltage amplitude of a modulator driving circuit required for obtaining the optical amplitude is defined, based on the above minimum reception sensitivity and the optical loss in the transmission system. Further, the inventor of the invention of the subject application found that the minimum electric power for light outputted from a light source is defined based on the optical amplitude of the output of the optical modulator and the extinction ratio and the optical loss of the optical modulator, and that electric power inputted to the light source is defined further based on the output-light electric power. Based on the above found matters, the inventor of the invention of the subject application found that consumed electric power in the whole of the transmission system in prior art is approximately equal to a sum of the electric power that is defined by use of the above explained procedures and inputted to the light source, the modulator driving circuit, and the TIA.

As a result of study of the above matters, the inventor of the invention of the subject application found that, in prior art, the amplitude of light inputted to the photoreceiver is small since no optical amplifier is used, and, as a result thereof, electric power consumption of the TIA becomes large in order to make the amplification factor of the TIA large. The inventor of the invention of the subject application also found that it is necessary to make electric power consumption of the light source and the modulator driving circuit large, in order to make the amplitude of the output light large.

In the following description, embodiments of the present invention, which are constructed based on the above found matters, will be explained with reference to the figures.

Figure 1:
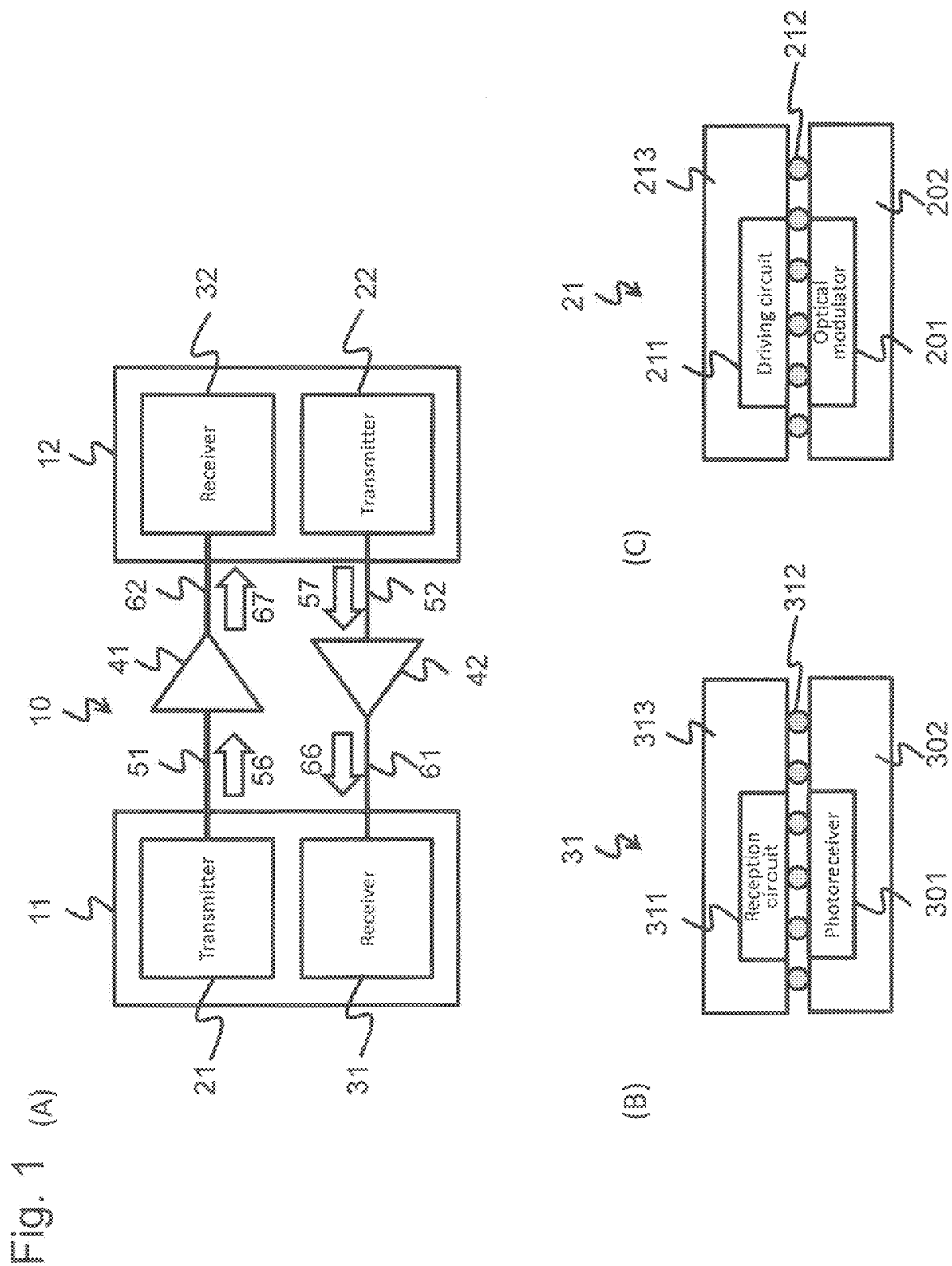
FIG. 1 (A) shows a block diagram of a network system according to an embodiment of the present invention.

FIG. 1 (A) shows a block diagram of a network system 10 according to an embodiment of the present invention. The network system 10 comprises a plurality of nodes including nodes 11 and 12 and a plurality of optical amplifiers including optical amplifiers 41 and 42. The optical amplifiers 41 and 42 may be optical fiber amplifiers or other optical amplifiers. The numbers of respective components shown in FIG. 1 (A) are mere examples. The network system 10 may comprise more numbers of nodes, optical amplifiers, optical waveguides, and so on.

The node 11 comprises a transmitter 21 configured to send a wavelength-division-multiplexed optical signal 56, and a receiver 31 configured to receive a wavelength-division-multiplexed optical signal 66. The node 12 comprises a transmitter 22 configured to send a wavelength-division-multiplexed optical signal 57, and a receiver 32 configured to receive a wavelength-division-multiplexed optical signal 67. The transmitter 21 is optically connected to an input of the optical amplifier 41 via an optical waveguide 51. The transmitter 22 is optically connected to an input of the optical amplifier 42 via an optical waveguide 52. The receiver 31 is optically connected to an output of the optical amplifier 42 via an optical waveguide 61. The receiver 32 is optically connected to an output of the optical amplifier 41 via an optical waveguide 62.

In FIG. 1 (A), it is shown in such a manner that the transmitter 21 and the optical amplifier 41 are directly connected via the optical waveguide 51. However, the configuration of the network system 10 of the present embodiment is not limited to the above construction. For example, various components including a wavelength multiplexer, a wavelength demultiplexer, a wavelength multiplexer/demultiplexer, an optical coupler, a cyclic wavelength routing device, an optical circulator, and so on may be arranged between the transmitter 21 and the optical amplifier 41. Similarly, various components may be arranged between the transmitter 22 and the optical amplifier 42.

FIG. 1 (B) shows a schematic cross-section view of the receiver 31 according to an embodiment of the present invention. The receiver 31 comprises a photoreceiver 301 and a reception circuit 311. The photoreceiver 301 and the reception circuit 311 may be formed in substrates 302 and 313, respectively. For example, the photoreceiver 301 is a photodiode, and configured to convert an optical signal to an analog electric signal. The reception circuit 311 receives an analog electric signal from the photoreceiver 301, and performs processing for amplifying it and/or converting it to a digital signal. In the present embodiment, the photoreceiver 301 and the reception circuit 311 are electrically connected by flip chip connection by use of bumps 312. The reception circuit 311 is constructed in such a manner that it does not include a transimpedance amplifier (TIA). The receiver 32 is also constructed in a manner similar to the manner in the case of the receiver 31.

In the present embodiment, the amplitude of the optical signal inputted to the photoreceiver 301 can be increased by introducing the optical amplifier 42. As a result thereof, it becomes unnecessary to put a TIA, which consumes large electric power, in the reception circuit 311, and becomes possible to reduce electric power consumption of the reception circuit 311. In the case that a TIA is not used, the cutoff frequency of the reception circuit 311 is determined based on the resistance value and the electric capacity of the reception circuit 311. In the present embodiment, by connecting the photoreceiver 301 and the reception circuit 311 by flip chip connection as explained above, the electric capacity can be made to be small, thus, a high-speed signal can be received. Further, a main noise source in the case that the optical amplifier 42 is used is beat noise of signal light and spontaneous emission light, and this noise is smaller than the thermal noise of an electric amplifier such as a TIA or the like. Thus, a system which realizes a better SNR can be constructed. Further, in the present embodiment, electric power consumption per a unit bit rate of the optical amplifier can be reduced, by amplifying wavelength-division-multiplexed light in a collective manner by the optical amplifier 42. Since the receiver 32 and the optical amplifier 41 comprise constructions similar to those of the receiver 31 and the optical amplifier 42 although FIG. 1 (B) does not show them, they have the above characteristics and advantageous points.

FIG. 1 (C) shows a schematic cross-section view of the transmitter 21 according to an embodiment of the present invention. The transmitter 21 comprises an optical modulator 201 and a driving circuit 211. The optical modulator 201 and the driving circuit 211 may be formed in substrates 202 and 213, respectively. The optical modulator 201 modulates light by use of an electric signal supplied from the driving circuit 211 to thereby generate an optical signal. In the present embodiment, the optical modulator 201 and the driving circuit 211 may be electrically connected by flip chip connection by use of bumps 212. By connecting the optical modulator 201 and the driving circuit 211 by flip chip connection, the electric capacity of the driving circuit 211 can be made to be small, thus, optical modulation using a high-speed signal can be realized.

The optical modulator 201 may be formed in the same substrate in which the photoreceiver 301 is formed. For example, the optical modulator 202 and the photoreceiver 301 (and other optical modulators and photoreceivers in other transmitters and receivers) may be formed in an SOI (Silicon on Insulator) layer formed on a buried oxide film layer on a silicon substrate, by use of a silicon photonics technique. Further, the driving circuit 211 and the reception circuit 311 may be constructed in such a manner that they are incorporated into the same LSI.

Figure 2:
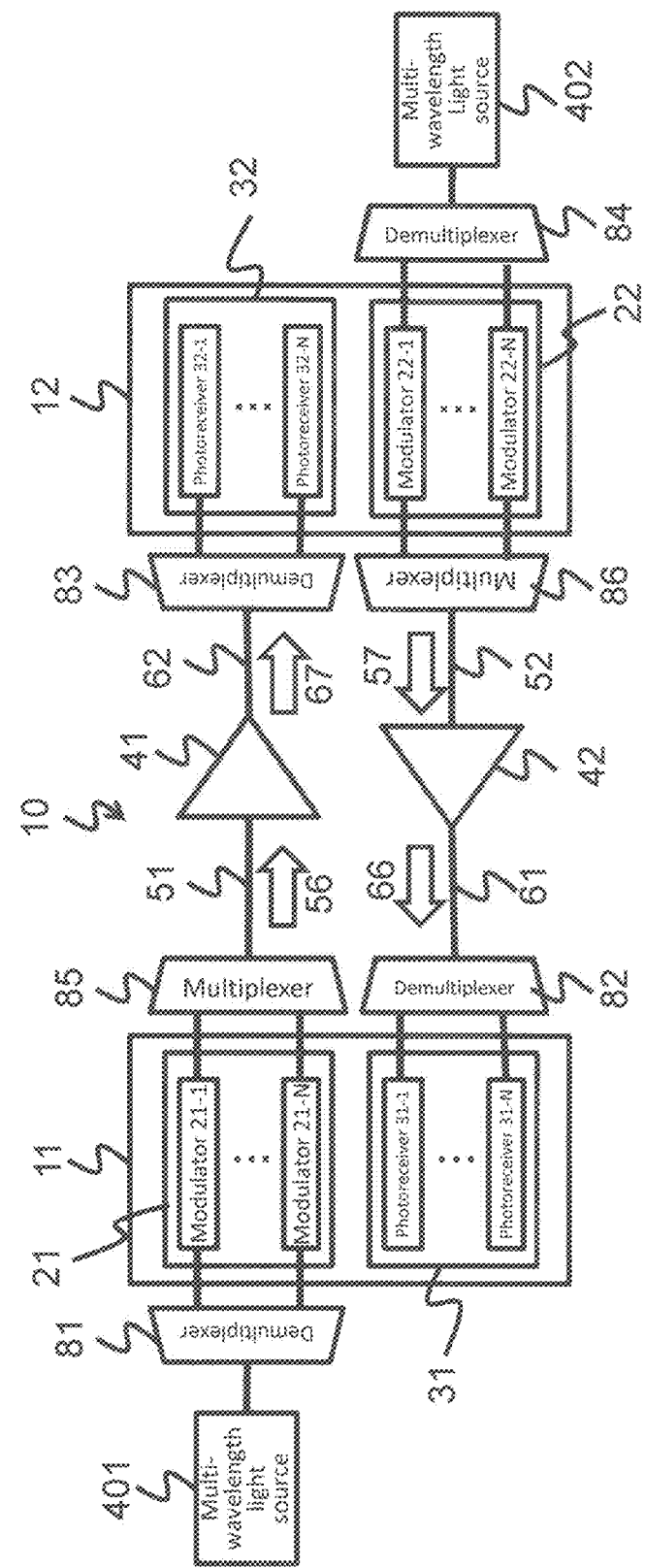
FIG. 2 is a block diagram showing details of an example configuration of the network system shown in FIG. 1.

FIG. 2 is a block diagram showing details of an example configuration of the network system 10 shown in FIG. 1. The network system 10 may comprise, in addition to the components shown in FIG. 1, multiwavelength light sources 401 and 402, demultiplexers 81, 82, 83, and 84, and multiplexers 85 and 86. The transmitters 21 and 22 may comprise a plurality of optical modulators 21-1 to 21-N and 22-1 to 22-N and a plurality of driving circuits (not shown in the figure), respectively. The receivers 31 and 32 may comprise a plurality of photoreceivers 31-1 to 31-N and 32-1 to 32-N and a plurality of reception circuits (not shown in the figure), respectively.

The multiwavelength light source 401 is configured to output wavelength-division-multiplexed light comprising a plurality of pieces (for example, N pieces) of light having different wavelengths. For example, the multiwavelength light source 401 may comprise a plurality of DFB lasers. Alternatively, the multiwavelength light source 401 may comprise a comb laser which outputs a plurality of pieces of light having different wavelengths. The wavelength-division-multiplexed light outputted from the multiwavelength light source 401 is divided by the demultiplexer 81 into pieces of light having respective wavelengths. The respective pieces of light having respective wavelengths are modulated by related optical modulators in the optical modulators 21-1 to 21-N, and outputted as optical signals. The respective optical signals having respective wavelengths are multiplexed by the multiplexer 85, and outputted as a wavelength-division-multiplexed optical signal 56. The wavelength-division-multiplexed optical signal 56 is inputted to the optical amplifier 41 via the waveguide 51, amplified by the optical amplifier 41, outputted as a wavelength-division-multiplexed optical signal 67, and inputted to the demultiplexer 83. The wavelength-division-multiplexed optical signal 67 is divided by the demultiplexer 83 into pieces of light having respective wavelengths. The respective optical signals having respective wavelengths are converted to electric signals by related photoreceivers in the photoreceivers 32-1 to 32-N. The multiwavelength light source 402, the demultiplexer 84, the optical modulators 22-1 to 22-N, the multiplexer 86, the optical amplifier 42, the demultiplexer 82, and the photoreceivers 31-1 to 31-N also function in manners similar to the above manners.

Figure 3:
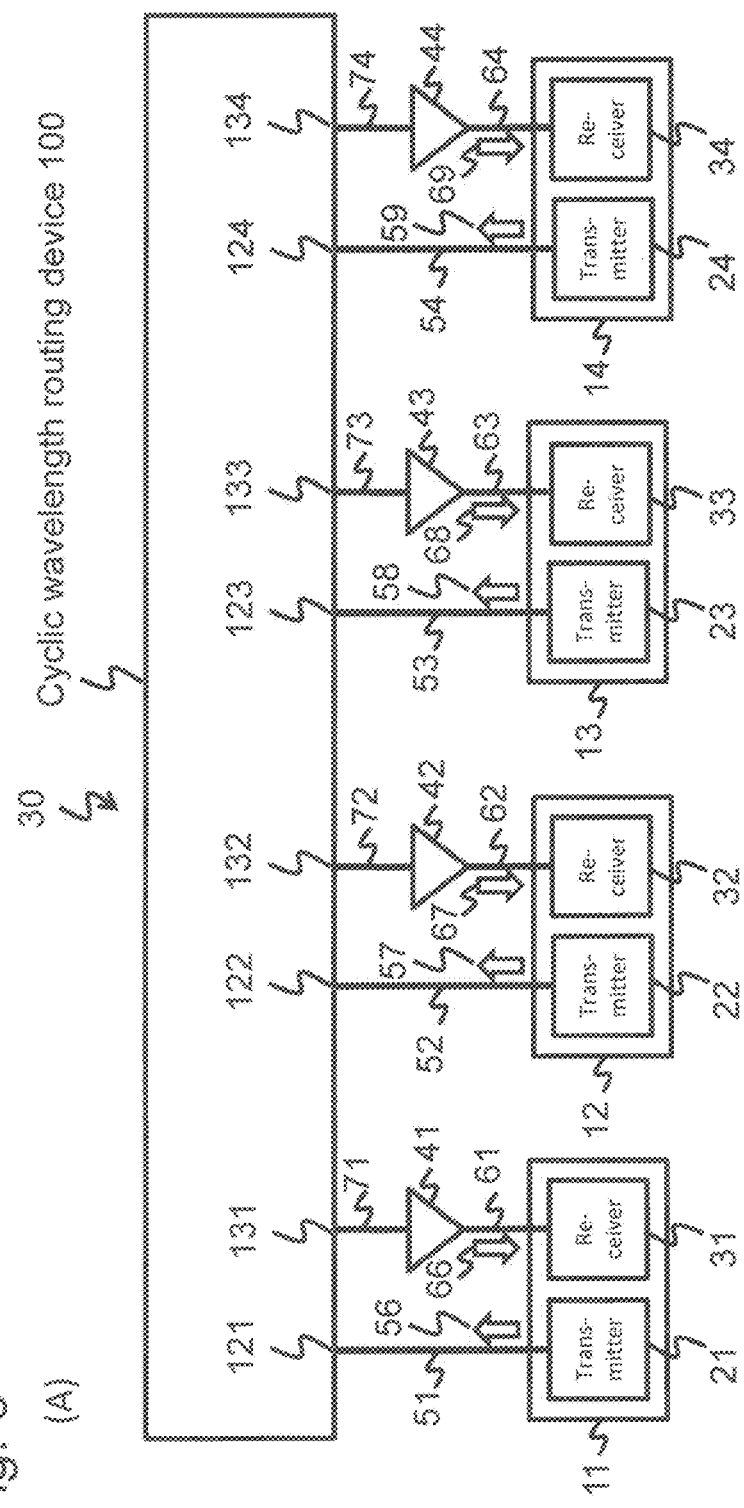
FIG. 3 (A) shows a block diagram of a network system according to an embodiment of the present invention.

FIG. 3 (A) shows a block diagram of a network system 30 according to an embodiment of the present invention. The network system 30 comprises a plurality of nodes including nodes 11, 12, 13, and 14, a cyclic wavelength routing device 100, and a plurality of optical amplifiers including optical amplifiers 41, 42, 43, and 44. The cyclic wavelength routing device 100 may be a cyclic arrayed waveguide grating. The nodes 11 to 14 comprise a transmitter 21 and a receiver 31, a transmitter 22 and a receiver 32, a transmitter 23 and a receiver 33, and a transmitter 24 and a receiver 34, respectively. Each of nodes 11 to 14 may comprise various components including the components shown in FIG. 1 and FIG. 2. The number of nodes is not limited to four and the number of optical amplifiers is not limited to four, and the numbers of them may be optional.

The cyclic wavelength routing device 100 comprises a first plurality of ports 121, 122, 123, and 124, and a second plurality of ports 131, 132, 133, and 134. In the present embodiment, the first plurality of ports 121 to 124 may function as input ports, and the second plurality of ports 131 to 134 may function as output ports. The cyclic wavelength routing device 100 is constructed in such a manner that it outputs pieces of light, depending on the wavelengths of the pieces of light and the ports from which the pieces of light are inputted, to different ports. FIG. 3 (B) is a table showing an example of a routing characteristic of the cyclic wavelength routing device 100. In this example, pieces of light having wavelengths λ1, λ2, λ3, and λ4 inputted to the port 121 in the first plurality of ports are outputted to the ports 132, 133, 134, and 131 in the second plurality of ports, respectively, for example. Pieces of light having wavelengths λ1, λ2, λ3, and λ4 inputted to the port 122 are outputted to the ports 133, 134, 131, and 132, respectively. Pieces of light having wavelengths λ1, λ2, λ3, and λ4 inputted to the port 123 are outputted to the ports 134, 131, 132, and 133, respectively. Pieces of light having wavelengths λ1, λ2, λ3, and λ4 inputted to the port 124 are outputted to the ports 131, 132, 133, and 134, respectively. The number of the first plurality of ports is not limited to four, the number of the second plurality of ports is not limited to four, and each of the numbers may be an optional number equal to or larger than two.

The transmitters 21 to 24 are optically connected, via optical waveguides 51 to 54, to the ports 121 to 124 of the cyclic wavelength routing device 100, respectively. The receivers 31 to 34 are optically connected, via optical waveguides 61 to 64, to outputs of optical amplifiers 41 to 44 of the cyclic wavelength routing device 100, respectively. Inputs of the optical amplifiers 41 to 44 are optically connected, via optical waveguides 71 to 74, to ports 131 to 134 of the cyclic wavelength routing device 100, respectively. The above components are not necessarily connected directly by using optical waveguides only. For example, various components including wavelength multiplexers, wavelength demultiplexers, wavelength multiplexer/demultiplexer's, optical couplers, optical attenuators, optical circulators, and so on may be arranged between the transmitters 21 to 24 and the ports 121 to 124, between the ports 131 to 134 and the optical amplifiers 41 to 44, and so on. Further, multiwavelength light sources (not shown in the figure) may be optically connected to the transmitters 21 to 24. Still further, as shown in FIG. 2, each of the transmitters 21 to 24 may include a plurality of modulators, and each of receivers 31 to 34 may include a plurality of photoreceivers.

During operation, the transmitters 21 to 24 generate wavelength-division-multiplexed optical signals and send them. The wavelength-division-multiplexed optical signals are inputted to the ports 121 to 124 in the first plurality of ports of the cyclic wavelength routing device 100, respectively. Each optical signal included in the wavelength-division-multiplexed optical signal is outputted, based on the wavelength thereof and the port in the first plurality of ports from which the optical signal is inputted, to related one of the second plurality of ports 131 to 134. For example, in the case that the wavelength-division-multiplexed optical signal inputted to the port 121 includes optical signals having wavelengths λ1, λ2, λ3, and λ4, the optical signal having the wavelength λ1 may be outputted to the port 132 in the second plurality of ports, the optical signal having the wavelength λ2 may be outputted to the port 133, the optical signal having the wavelength λ3 may be outputted to the port 134, and the optical signal having the wavelength λ4 may be outputted to the port 131. In this manner, the wavelength-division-multiplexed optical signals are outputted from the ports 131 to 134 in the second plurality of ports, respectively. The wavelength-division-multiplexed optical signals outputted from the ports 131 to 134 are amplified by the optical amplifiers 41 to 44, and inputted to the receiver 31 to 34 to be converted to electric signals, respectively.

The numbers of the respective kinds of components, such as the nodes, the transmitters, the receivers, the optical amplifiers, and so on, shown in FIG. 3 are mere examples. The network system 30 of the present embodiment may comprise optional numbers of such respective various kinds of components.

Each of the receivers 31 to 34 in the embodiment shown in FIG. 3 comprises a photoreceiver and a reception circuit such as those explained in relation to FIG. 1 (B). Each of the transmitters 21 to 24 in the embodiment shown in FIG. 3 comprises an optical modulator and a driving circuit such as those explained in relation to FIG. 1 (C). The photoreceiver and the reception circuit are electrically connected by flip chip connection. The reception circuit is constructed in such a manner that it does not include a TIA. Thus, according to the network system 30 in the present embodiment, it includes the optical amplifiers 41 to 44, and it does not require a TIA to be put in the reception circuit of each of the receivers 31 to 34. Accordingly, the network system 30 has characteristics and advantageous points that are similar to those explained in relation to FIG. 1 (B).

In addition to the above effect, the network system 30 of the present embodiment further has an advantage that the numbers of optical waveguides and optical amplifiers can be reduced compared with those in the network system 10 shown in FIG. 1. Specifically, in the network system 10, in the case that N nodes are connected in a full mesh manner, 2N*(N−1) optical waveguides and N*(N−1) optical amplifiers are required. On the other hand, regarding the network system 30, it may be sufficient if the network system 30 comprises 3N optical waveguides and N optical amplifiers. Thus, according to the network system of the present embodiment, the number of optical components can be reduced, and miniaturization and cost reduction of the system can be realized.

FIG. 4 shows a block diagram of a network system 40 according to an embodiment of the present invention. The network system 40 comprises a plurality of nodes including nodes 11, 12, 13, and 14, a cyclic wavelength routing device 100, a plurality of optical amplifiers including optical amplifiers 41, 42, 43, and 44, multiwavelength light sources 401, 402, 403, and 404, and a plurality of circulators including optical circulators 411, 412, 413, and 414. The nodes 11 to 14 comprise a transmitter 21 and a receiver 31, a transmitter 22 and a receiver 32, a transmitter 23 and a receiver 33, and a transmitter 24 and a receiver 34, respectively. Each of nodes 11 to 14 may comprise various components including the components shown in FIG. 1 and FIG. 2. Each of the receivers 31 to 34 comprises a photoreceiver and a reception circuit such as those explained in relation to FIG. 1 (B). Each of the transmitters 21 to 24 may comprise an optical modulator and a driving circuit such as those explained in relation to FIG. 1 (C). The photoreceiver and the reception circuit are electrically connected by flip chip connection. The reception circuit is constructed in such a manner that it does not include a TIA. Each of the optical circulators 411 to 414 comprises at least three ports, and is configured to output light, that is inputted to a first port, from a second port, and output the light, that is inputted to the second port, from a third port. The numbers of respective kinds of components, such as nodes, transmitters, receivers, optical amplifiers, and so on, included in the network system 40 are not limited to the numbers of them shown in the figure, and each of the numbers may be an optional number equal to or larger than two.

The first ports of the optical circulators 411 to 414 are optically connected, via optical waveguides 141 to 144, to the multiwavelength light sources 401 to 404, respectively. The second ports of the optical circulators 411 to 414 are optically connected, via optical waveguides 151 to 154, to the transmitters 21 to 24 (or groups of optical modulators which will be explained later), respectively. The third ports of the optical circulators 411 to 414 are optically connected, via optical waveguides 181 to 184, to ports 121 to 124 in a first plurality of ports of the cyclic wavelength routing device 100, respectively. The receivers 31 to 34, the optical amplifiers 41 to 44, and ports 131 to 134 in a second plurality of ports of the cyclic wavelength routing device 100 may be connected in a manner similar to the manner in the case of the embodiment shown in FIG. 3.

FIG. 5A (a) is a block diagram showing a configuration of the transmitter 21 and relation of connection between the transmitter 21 and the optical circulator 411 in the embodiment shown in FIG. 4. In the present embodiment, the transmitter 21 comprises a group of optical modulators 421, and a group of light folding devices 431 optically connected to the group of optical modulators 421. The group of optical modulators 421 may comprise, for example, a plurality of optical modulators such as optical modulators 21-1 to 21-N shown in FIG. 2. The group of light folding devices 431 may comprise a plurality of light folding devices relating to the plurality of optical modulators. FIG. 5A (b) shows an example configuration of each of light folding devices 431-1 to 431-N which may be included in the group of light folding devices 431. For example, the light folding device may be a loop mirror comprising a 3-dB coupler 501 and an optical waveguide 191. The group of optical modulators 421 is optically connected, via optical waveguides 161, to the group of light folding devices 431. Also, the group of optical modulators 421 is optically connected, via an optical waveguide 151, to the second port of the optical circulator 411. A wavelength multiplexer/demultiplexer 87 may be positioned between the group of optical modulators 421 and the second port of the optical circulator 411. Each of other transmitters 22, 23, and 24 in the embodiment shown in FIG. 4 may include a group of optical modulators and a group of light folding devices similar to the group of optical modulators 421 and the group of light folding devices 431, respectively; and the transmitters 22, 23, and 24 may be connected to the second ports of the optical circulators 412, 413, and 414 via wavelength multiplexer/demultiplexer's, each of which is similar to the wavelength multiplexer/demultiplexer 87, respectively, although such constructions are not shown in the figure.

The group of optical modulators 421 (and other optical modulators in other transmitters and receivers) may be formed in an SOI (Silicon on Insulator) layer formed on a buried oxide film layer on a silicon substrate, by use of a silicon photonics technique.

Each of the receivers 31 to 34 may comprise a group of photoreceivers comprising a plurality of photoreceivers, although such a construction is not shown in the figure. Also, a wavelength demultiplexer may be arranged at a position before a position of each group of photoreceivers. Outputs of the optical amplifiers 41 to 44 are optically connected, via wavelength demultiplexers arranged at positions before positions of the receivers 31 to 34, to groups of photoreceivers in the receivers 31 to 34, respectively.

During operation, the multiwavelength light sources 401 to 404 output wavelength-division-multiplexed light 441 to 444, respectively. The wavelength-division-multiplexed light 441 to 444 is inputted to the first ports of the optical circulators 411 to 414, outputted from the second ports of the optical circulators 411 to 414 (for example, the wavelength-division-multiplexed light 451 in FIG. 5), and inputted to the wavelength multiplexer/demultiplexer's (for example, the wavelength multiplexer/demultiplexer 87 in FIG. 5) to be divided into pieces of light based on wavelengths, respectively. The respective pieces of light having respective wavelengths are inputted to respective related optical modulators in the respective groups of optical modulators in the respective transmitters (for example, the group of optical modulators 421 in FIG. 5), and outputted as respective modulated optical signals (for example, the optical signal 461 in FIG. 5). These optical signals are folded (for example, the optical signal 471 in FIG. 5) by respective groups of light folding devices (for example, the group of light folding devices 431 in FIG. 5) in the respective transmitters, inputted again to the respective related optical modulators in the respective groups of optical modulators, and inputted to the respective wavelength multiplexer/demultiplexer's. These optical signals are multiplexed by the respective wavelength multiplexer/demultiplexer's, and outputted as wavelength-division-multiplexed optical signals 56 to 59. The wavelength-division-multiplexed optical signals 56 to 59 are inputted to the second ports of the optical circulators 411 to 414, outputted from the third ports of the optical circulators 411 to 414, and inputted to the port 121 to 124 in the first plurality of ports of the cyclic wavelength routing device 100, respectively. Based on the wavelength of each optical signal included in each of the wavelength-division-multiplexed optical signals 56 to 59 and the port to which the optical signal is inputted, a port in the second plurality of ports 131 to 134, from which the optical signal is to be outputted, is determined. In this manner, the wavelength-division-multiplexed optical signals 66 to 69 are outputted from the ports 131 to 134, respectively. The wavelength-division-multiplexed optical signals 66 to 69 outputted from the ports 131 to 134 are amplified by the optical amplifiers 41 to 44, and inputted to the receivers 31 to 34 to be converted to electric signals, respectively.

Each of (a)-(c) of FIG. 5B is a block diagram of an example configuration of the transmitter 21 in the embodiment shown in FIG. 4. As shown in FIG. 5B (a), in an embodiment, each of optical modulators 421-1 to 421-N included in a group of optical modulators 421 may be an electroabsorption modulator (EAM). In such a case, each of light folding devices 431-1 to 431-N included in a first group of light folding devices 431 may be a loop mirror (LM). Respective pairs comprising respective EAMs and LMs treat respective different wavelengths. For example, the pair of the EAM 421-1 and the LM 431-1 may be used for modulating light having the wavelength $\lambda 1$. The pair of the EAM 421-N and the LM 431-N may be used for modulating light having the wavelength $\lambda N$.

As shown in FIG. 5B (b), in another embodiment, a Michelson-interferometer-type modulator may be formed by an optical modulator in the group of optical modulators 421 and a light folding device in the group of light folding devices 431. In this example, the transmitter 21 may comprise a plurality of 3-dB couplers 511-1 to 511-N. The group of optical modulators 421 may include a plurality of pairs of phase modulators (PSs) (for example, a pair comprising a PS 421-1a and a PS 421-1b, a pair comprising a PS 421-Na and a PS 421-Nb, and so on). The group of light folding devices 431 may include a plurality of pairs of LMs (for example, a pair comprising a LM 431-1a and a LM 431-1b, a pair comprising a LM 431-Na and a LM 431-Nb, and so on). Respective combinations of the 3-dB couplers, pairs of PSs, and pairs of LMs treat respective different wavelengths. For example, a combination comprising the 3-dB coupler 511-1, the pair comprising the PS 421-1a and the PS 421-1b, and the pair comprising the LM 431-1a and the LM 431-1b may be used for modulating light having the wavelength λ1. A combination comprising the 3-dB coupler 511-N, the pair comprising the PS 421-Na and the PS 421-Nb, and the pair comprising the LM 431-Na and the LM 431-Nb may be used for modulating light having the wavelength λN.

As shown in FIG. 5B (c), in a further embodiment, each of the optical modulators 421-1 to 421-N in the group of optical modulators 421 may be a ring modulator. In this example, the optical modulators 421-1 to 421-N are connected in series. Each of the light folding devices 431-1 to 431-N may be an LM. Respective ring modulators treat respective different wavelengths. For example, the ring modulator 421-1 may be used for modulating light having the wavelength λ1. The ring modulator 421-N may be used for modulating light having the wavelength λN. In the example shown in FIG. 5B (c), the wavelength multiplexer/demultiplexer 87 is not necessary, and the transmitter 21 may be connected directly to the optical circulator 411.

The network system 40 according to the present embodiment provides effect similar to that obtainable from each of the network systems 10 and 30 in other embodiments. Further, in the network system 40 according to the present embodiment, the number of optical waveguides connected to each transmitter and the number of wavelength multiplexer/demultiplexer's used in each transmitter can be reduced, compared with those in each of the network systems 10 and 30. Thus, miniaturization and cost reduction of the transmitter can be realized. Specifically, in the case of each of the network systems 10 and 30, a wavelength demultiplexer and an optical waveguide arranged between a light source and a transmitter are required. On the other hand, in the case of the network system 40, since a wavelength multiplexer/demultiplexer (for example, the wavelength multiplexer/demultiplexer 87 in FIG. 5) has the function of a wavelength demultiplexer in addition to the function of a wavelength multiplexer, a wavelength demultiplexer and an optical waveguide such as those explained above are not required. Further, in the network system 40, pieces of light having respective wavelengths are modulated while they propagate through the related optical modulators in a round trip manner. Thus, the network system according to the present embodiment can obtain a degree of modulation, that is equivalent to the degree of modulation obtainable from a system in which light is modulated while the light propagates through an optical modulator in a single direction, by using an optical modulator having a half length or by making the magnitude of voltage applied to an optical modulator a half thereof. Accordingly, miniaturization, reduction of electric power consumption, and speeding up of the optical modulator can be realized.

FIG. 6 shows a block diagram of a network system 60 according to an embodiment of the present invention. When compared with the network system 40 shown in FIG. 4, the configuration of the multiwavelength light source in the network system 60 is different from that in network system 40. In the embodiment shown in FIG. 6, the multiwavelength light source comprises a comb laser 405, and a splitter 406 optically connected to an output of the comb laser 405 and comprising a plurality of outputs. The respective outputs of the splitter 406 are optically connected to respective transmitters 21 to 24 (or groups of optical modulators in the transmitters 21 to 24). For example, as shown in FIG. 6, optical amplifiers 91 to 94 may be arranged between the plurality of outputs of the splitter 406 and the optical circulators 411 to 414, respectively.

According to the present embodiment, since a plurality of multiwavelength light sources can be replaced by a single comb laser and a single splitter, miniaturization and cost reduction of the system can be realized.

Since the configuration of the network system 60, except for the configuration of the multiwavelength light source therein, is the same as that of the network system 40 shown in FIG. 4, explanation thereof will be omitted.

FIG. 7 (A) shows a block diagram of a network system 70 according to an embodiment of the present invention. The network system 70 comprises a plurality of nodes including nodes 11, 12, 13, and 14, a cyclic wavelength routing device 100, a plurality of optical amplifiers including optical amplifiers 41, 42, 43, 44, 45, 46, 47, and 48, multiwavelength light sources 401, 402, 403, and 404, and a plurality of circulators including optical circulators 511, 512, 512, 514, 515, 516, 517, and 518. The nodes 11 to 14 comprise a transmitter 21 and a receiver 31, a transmitter 22 and a receiver 32, a transmitter 23 and a receiver 33, and a transmitter 24 and a receiver 34, respectively. Each of the receivers 31 to 34 comprises a photoreceiver and a reception circuit such as those explained in relation to FIG. 1 (B). Each of the transmitters 21 to 24 may comprise an optical modulator and a driving circuit such as those explained in relation to FIG. 1 (C). The photoreceiver and the reception circuit are electrically connected by flip chip connection. The reception circuit is constructed in such a manner that it does not include a TIA. Each of nodes 11 to 14 may comprise various components including the components shown in FIG. 1 and FIG. 2. Each of the optical circulators 511 to 518 comprises at least four ports, and is configured to output light, that is inputted to a first port, from a second port, output the light, that is inputted to the second port, from a third port, and output the light, that is inputted to the third port, from a fourth port. The numbers of respective kinds of components, such as nodes, transmitters, receivers, optical amplifiers, optical circulators, and so on, included in the network system 70 are not limited to the numbers of them shown in the figure, and each of the numbers may be optional.

First ports of the optical circulators 511 and 515, first ports of the optical circulators 512 and 516, first ports of the optical circulators 513 and 517, and first ports of the optical circulators 514 and 518 are optically connected to the multiwavelength light sources 401, 402, 403, and 404, respectively. Second ports of the optical circulators 511 and 515, second ports of the optical circulators 512 and 516, second ports of the optical circulators 513 and 517, and second ports of the optical circulators 514 and 518 are optically connected to the transmitters 21, 22, 23, and 24, respectively. For example, each of the transmitters 21, 22, 23, and 24 may comprise two groups of optical modulators and two groups of light folding devices, although such a construction is not shown in the figure. Also, two wavelength multiplexer/demultiplexer's relating to two groups of optical modulators in each transmitter may be arranged at positions before positions of the two groups of optical modulators, respectively. In such a case, the second port of the optical circulator 511 is optically connected to a first group of optical modulators in the transmitter 21, via a first wavelength multiplexer/demultiplexer in the two wavelength multiplexer/demultiplexer's for the transmitter 21.

Also, the second port of the optical circulator 515 is optically connected to a second group of optical modulators in the transmitter 21, via a second wavelength multiplexer/demultiplexer in the two wavelength multiplexer/demultiplexer's for the transmitter 21. In a similar manner, the optical circulators 512 and 516 are connected to related two wavelength multiplexer/demultiplexer's, related two groups of optical modulators, and related two groups of light folding devices, the optical circulators 513 and 517 are connected to related two wavelength multiplexer/demultiplexer's, related two groups of optical modulators, and related two groups of light folding devices, and the optical circulators 514 and 518 are connected to related two wavelength multiplexer/demultiplexer's, related two groups of optical modulators, and related two groups of light folding devices. Third ports of the optical circulators 511, 512, 513, and 514 are optically connected to ports 121, 122, 123, and 124 in a first plurality of ports of the cyclic wavelength routing device 100, respectively. Third ports of the optical circulators 515, 516, 517, and 518 are optically connected to ports 131, 132, 133, and 134 in a second plurality of ports of the cyclic wavelength routing device 100, respectively. Fourth ports of the optical circulators 511, 512, 513, and 514 are optically connected to inputs of the optical amplifiers 45, 46, 47, and 48, respectively. Fourth ports of the optical circulators 515, 516, 517, and 518 are optically connected to inputs of the optical amplifiers 41, 42, 43, and 44, respectively. Outputs of the optical amplifiers 41 and 45, outputs of the optical amplifier 42 and 46, outputs of the optical amplifier 43 and 47, and outputs of the optical amplifier 44 and 48 are optically connected to the receivers 31, 32, 33, and 34, respectively. For example, each of the receivers 31 to 34 may comprise two groups of photoreceivers, although such a construction is not shown in the figure. Also, two wavelength demultiplexers relating to two groups of photoreceivers may be arranged at positions before positions of the two groups of photoreceivers, respectively. In such a case, the output of the optical amplifier 41 and the output of the optical amplifier 45 are optically connected to a first group of photoreceivers and a second group of photoreceivers in the receiver 31, via a first wavelength demultiplexer and a second wavelength demultiplexer in the two wavelength demultiplexers for the receiver 31, respectively. In a similar manner, outputs of the optical amplifiers 42 and 46 are connected to related two wavelength demultiplexers and related two groups of photoreceivers, outputs of the optical amplifiers 43 and 47 are connected to related two wavelength demultiplexers and related two groups of photoreceivers, and outputs of the optical amplifiers 44 and 48 are connected to related two wavelength demultiplexers and related two groups of photoreceivers.

During operation, wavelength-division-multiplexed light outputted from the multiwavelength light sources 401 to 404 is inputted to the first ports of the optical circulators 511 and 515, the first ports of the optical circulators 512 and 516, the first ports of the optical circulators 513 and 517, and the first ports of the optical circulators 514 and 518, and outputted from the second ports of the optical circulators 511 and 515, the second ports of the optical circulators 512 and 516, the second ports of the optical circulators 513 and 517, and the second ports of the optical circulators 514 and 518, respectively. The wavelength-division-multiplexed light outputted from each of the second ports of the optical circulators 511, 512, 513, and 514 is inputted to a first wavelength multiplexer in the two wavelength multiplexer/demultiplexer's for related one of the transmitters 21, 22, 23, and 24 to be divided into pieces of light based on wavelengths. The respective pieces of light having respective wavelengths propagate through related optical modulators in a first group of optical modulators in the two groups of optical modulators in a round trip manner, via light folding devices, in each transmitter to be outputted as optical signals, and the optical signals are multiplexed by the first wavelength multiplexer/demultiplexer. On the other hand, wavelength-division-multiplexed light outputted from each of the second ports of the optical circulators 515, 516, 517, and 518 is inputted to a second wavelength multiplexer/demultiplexer in the two wavelength multiplexer/demultiplexer's for related one of the transmitters 21, 22, 23, and 24 to be divided into pieces of light based on wavelengths. The respective pieces of light having respective wavelengths propagate through related optical modulators in a second group of optical modulators in the two groups of optical modulators in a round trip manner, via light folding devices, in each transmitter to be outputted as optical signals, and the optical signals are multiplexed by the second wavelength multiplexer/demultiplexer. The wavelength-division-multiplexed optical signals outputted from the first wavelength multiplexer/demultiplexer's of the transmitters 21, 22, 23, and 24 are inputted to second ports of the optical circulators 511, 512, 513, and 514, outputted from third ports thereof, and inputted to the ports 121, 122, 123, and 124 in the first plurality of ports of the cyclic wavelength routing device 100, respectively. On the other hand, the wavelength-division-multiplexed optical signals outputted from the second wavelength multiplexer/demultiplexer's of the transmitters 21, 22, 23, and 24 are inputted to second ports of the optical circulators 515, 516, 517, and 518, outputted from third ports thereof, and inputted to the ports 131, 132, 133, and 134 in the second plurality of ports of the cyclic wavelength routing device 100, respectively.

FIG. 7 (B) is a table showing an example of a routing characteristic of the cyclic wavelength routing device 100. In the present embodiment, each of the ports 121 to 124 and 131 to 134 can function as both an input port and an output port of the cyclic wavelength routing device 100. For example, optical signals having wavelengths $\lambda 1$, $\lambda 2$, $\lambda 3$, and $\lambda 4$ inputted to the port 121 are outputted to the ports 132, 133, 134, and 131, respectively. Optical signals having wavelengths $\lambda 1$, $\lambda 2$, $\lambda 3$, and $\lambda 4$ inputted to the port 131 are outputted to the ports 124, 123, 122, and 121, respectively. In this manner, in the network system 70 of the present embodiment, the cyclic wavelength routing device 100 and optical waveguides connected thereto can be used for bidirectional communication. The wavelength-division-multiplexed optical signals outputted, through the cyclic wavelength routing device 100, from the ports 121 to 124 in the first plurality of ports are inputted to third ports of the optical circulators 511 to 514, and outputted from fourth ports thereof to be inputted to the optical amplifiers 45 to 48, respectively. The wavelength-division-multiplexed optical signal outputted from each of the optical amplifiers 45 to 48 is inputted to a second demultiplexer in the two wavelength demultiplexer's for related one of the receivers 31 to 34 to be divided into optical signals based on wavelengths. The pieces of light having respective wavelengths are inputted to related photoreceivers in a second group of photoreceivers in the two groups of photoreceivers in the respective receivers, and converted to electric signals. On the other hand, the wavelength-division-multiplexed optical signals outputted, through the cyclic wavelength routing device 100, from the ports 131 to 134 in the second plurality of ports are inputted to third ports of the optical circulators 515 to 518, and outputted from fourth ports thereof to be inputted to the optical amplifiers 41 to 44, respectively. The wavelength-division-multiplexed optical signal outputted from each of the optical amplifiers 41 to 44 is inputted to a first demultiplexer in the two wavelength demultiplexer's for related one of the receivers 31 to 34 to be divided into optical signals based on wavelengths. The pieces of light having respective wavelengths are inputted to related photoreceivers in a first group of photoreceivers in the two groups of photoreceivers in the respective receivers, and converted to electric signals.

According to the network system 70 of the present embodiment, the cyclic wavelength routing device 100 and optical waveguides connected thereto (for example, an optical waveguide between the port 121 of the cyclic wavelength routing device 100 and the third port of the optical circulator 511, an optical waveguide between the port 131 of the cyclic wavelength routing device 100 and the third port of the optical circulator 516, and so on) can be used for bidirectional communication. Thus, compared with each of the network systems 40 and 60 shown in FIGS. 4 and 6, the bandwidth between nodes can be doubled by using the same number of wavelengths and the same number of cyclic wavelength routing devices. Accordingly, widening of the band, miniaturization, and cost reduction of the network system can be realized.

Although the present invention has explained with reference to specific embodiments, it is intended that the embodiments disclosed in this specification are not used to interpret the present invention in a limiting way, and that the embodiments disclosed in this specification are examples used for explaining the present invention. It is obvious to a person skilled in the art that other alternative embodiments can be implemented without departing from the scope of the present invention.

REFERENCE SIGNS LIST

10, 30, 40, 60, 70 . . . Network system
11, 12, 12, 14 . . . Node
21, 22, 23, 24 . . . Transmitter
31, 32, 33, 34 . . . Receiver
41, 42, 43, 44, 45, 46, 47, 48, 91, 92, 93, 94 . . . Optical amplifier
51, 52, 53, 54, 61, 62, 63, 64, 71, 72, 73, 74, 141, 142, 143, 144, 151, 152, 153, 154, 161, 181, 182, 183, 184, 191 . . . Optical waveguide(s)
56, 57, 58, 59, 66, 67, 68, 69, 461, 471 . . . Optical signal
81, 82, 83, 84 . . . Demultiplexer
85, 86 . . . Multiplexer
87 . . . Multiplexer/demultiplexer
100 . . . Cyclic wavelength routing device
121, 122, 123, 124, 131, 132, 133, 134 . . . Port
201 . . . Optical modulator
202, 213, 302, 313 . . . Substrate
211 . . . Driving circuit
212, 312 . . . Bump
301 . . . Photoreceiver
311 . . . Reception circuit
401, 402, 403, 404 . . . Multiwavelength light source
405 . . . Comb laser
406 . . . Splitter
411, 412, 413, 414, 511, 512, 513, 514, 515, 516, 517, 518 . . . Optical circulator
421 . . . Group of optical modulators
421-1, 421-N, 421-1*a*, 421-1*b*, 421-Na, 421-Nb . . . Optical modulator
431 . . . Group of light folding devices
431-1, 431-N, 431-1*a*, 431-1*b*, 431-Na, 431-Nb . . . Light folding device
441, 442, 443, 444, 451 . . . Light
501, 511-1, 511-N . . . 3-dB coupler

The invention claimed is:

1. A network system comprising:
a plurality of nodes comprising at least a first node and a second node, wherein the first node comprises a first transmitter configured to send a first wavelength-division-multiplexed optical signal and a first receiver configured to receive a second wavelength-division-multiplexed optical signal, and the second node comprises a second transmitter configured to send a third wavelength-division-multiplexed optical signal and a second receiver configured to receive a fourth wavelength-division-multiplexed optical signal;
a plurality of optical amplifiers comprising at least a first optical amplifier and a second optical amplifier, wherein the first transmitter and the second transmitter are optically connected to an input of the first optical amplifier and an input of the second optical amplifier, respectively, and the first receiver and the second receiver are optically connected to an output of the first optical amplifier and an output of the second optical amplifier, respectively;
a cyclic wavelength routing device comprising a first plurality of ports and a second plurality of ports,
a plurality of multiwavelength light sources comprising at least a first multiwavelength light source and a second multiwavelength light source which are configured to output wavelength-division-multiplexed light; and
a plurality of optical circulators comprising at least a first optical circulator and a second optical circulator, wherein
the first receiver comprises a first photoreceiver and a first reception circuit, the second receiver comprises a second photoreceiver and a second reception circuit, the first photoreceiver and the second photoreceiver are electrically connected, by flip chip connection, to the first reception circuit and the second reception circuit, respectively; and neither the first reception circuit nor the second reception circuit comprises a transimpedance amplifier,
the first transmitter and the second transmitter are optically connected to a first port and a second port in the first plurality of ports of the cyclic wavelength routing device, respectively, and the input of the first optical amplifier and the input of the second optical amplifier are optically connected to a first port and a second port in the second plurality of ports of the cyclic wavelength routing device, respectively,
the first transmitter comprises a first group of optical modulators and a first group of light folding devices optically connected to the first group of optical modulators, and the second transmitter comprises a second group of optical modulators and a second group of light folding devices optically connected to the second group of optical modulators,
each of the plurality of optical circulators comprises at least three ports, and is configured to output light, that is inputted to a first port, from a second port, and output the light, that is inputted to the second port, from a third port, the first port of the first optical circulator and the first port of the second optical circulator are optically connected to the first multiwavelength light source and the second multiwavelength light source, respectively, the second port of the first optical circulator and the second port of the second optical circulator are optically connected to the first transmitter and the second transmitter, respectively, and the third port of the first optical circulator and the third port of the second optical circulator are optically connected to a first port and a second port in the first plurality of ports of the cyclic wavelength routing device, respectively, and the wavelength-division-multiplexed light inputted to the first transmitter and the wavelength-division-multiplexed light inputted to the second transmitter propagate through the first group of optical modulators and the second group of optical modulators in a round trip manner via the first group of light folding devices and the second group of light folding devices, and are sent from the first transmitter and the second transmitter as the first and third wavelength-division-multiplexed optical signals, respectively.

2. The network system according to claim 1 further comprising:

a plurality of wavelength multiplexer/demultiplexers comprising a first wavelength multiplexer/demultiplexer positioned between the first optical circulator and the first group of optical modulators, and a second wavelength multiplexer/demultiplexer positioned between the second optical circulator and the second group of optical modulators, wherein each optical modulator in the first group of optical modulators and the second group of optical modulators is an electroabsorption modulator, and each light folding device in the first group of light folding devices and the second group of light folding devices is a loop mirror.

3. The network system according to claim 1 further comprising:

a plurality of wavelength multiplexer/demultiplexers comprising a first wavelength multiplexer/demultiplexer positioned between the first optical circulator and the first group of optical modulators, and a second wavelength multiplexer/demultiplexer positioned between the second optical circulator and the second group of optical modulators, wherein a Michelson-interferometer-type modulator is formed by an optical modulator in the first group of optical modulators and the second group of optical modulators and a light folding device in the first group of light folding devices and the second group of light folding devices.

4. The network system according to claim 1, wherein each optical modulator in the first group of optical modulators and the second group of optical modulators is a ring modulator, and each light folding device in the first group of light folding devices and the second group of light folding devices is a loop mirror.

5. The network system according to claim 1, wherein the plurality of optical amplifiers comprises a third optical amplifier and a fourth optical amplifier, wherein an output of the third optical amplifier and an output of the fourth optical amplifier are optically connected to the first receiver and the second receiver, respectively, each of the plurality of optical circulators comprises a fourth port, and is configured to output light, that is inputted to the third port, from the fourth port, and the fourth port of the first optical circulator and the fourth port of the second optical circulator are optically connected to an input of the third optical amplifier and an input of the fourth optical amplifier, respectively, the plurality of optical circulators comprise a third optical circulator and a fourth optical circulator, and the first port of the third optical circulator and the first port of the fourth optical circulator are optically connected to the first multiwavelength light source and the second multiwavelength light source, respectively, the second port of the third optical circulator and the second port of the fourth optical circulator are optically connected to the first transmitter and the second transmitter, respectively, the third port of the third optical circulator and the third port of the fourth optical circulator are optically connected to a first port and a second port in the second plurality of ports of the cyclic wavelength routing device, respectively; and the fourth port of the third optical circulator and the fourth port of the fourth optical circulator are optically connected to the input of the first optical amplifier and the input of the second optical amplifier, respectively.

6. The network system according to claim 1, wherein the first group of optical modulators and the second group of optical modulators are formed in an SOI (Silicon on Insulator) layer formed on a buried oxide film layer on a silicon substrate.

7. The network system according to claim 1, wherein the first photoreceiver and the second photoreceiver are formed in an SOI (Silicon on Insulator) layer formed on a buried oxide film layer on a silicon substrate.

8. The network system according to claim 1, wherein each of the plurality of optical amplifiers is an optical fiber amplifier.

9. The network system according to claim 1, wherein the cyclic wavelength routing device is a cyclic arrayed waveguide grating.

10. The network system according to claim 1, wherein each of the plurality of multiwavelength light sources comprises a comb laser.

11. The network system according to claim 1, wherein the plurality of multiwavelength light sources comprises:

a comb laser; and a splitter optically connected to an output of the comb laser and comprising a plurality of outputs, wherein a first output and a second output in the plurality of outputs are optically connected to the first transmitter and the second transmitter, respectively.

12. The network system according to claim 11 further comprising:

an optical amplifier positioned between the first output of the splitter and the first transmitter, and an optical amplifier positioned between the second output of the splitter and the second transmitter.

13. The network system according to claim 1, wherein the first transmitter and the second transmitter comprise a first driving circuit and a second driving circuit, respectively; and the first group of optical modulators and the second group of optical modulators are electrically connected, by flip chip connection, to the first driving circuit and the second driving circuit, respectively.

* * * * *